United States Patent
An et al.

(10) Patent No.: US 7,876,147 B1
(45) Date of Patent: Jan. 25, 2011

(54) BACKGROUND OFFSET CANCELLATION SCHEME FOR CONTINUOUS TIME GM-C FILTERS

(75) Inventors: Fu-Tai An, San Jose, CA (US); Xuemei Liu, Milpitis, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/472,229

(22) Filed: May 26, 2009

Related U.S. Application Data (60) Provisional application No. 61/059,953, filed on Jun. 9, 2008.

(51) Int. Cl.
*H03K 5/00* (2006.01)
(52) U.S. Cl. ...................... 327/553; 327/552
(58) Field of Classification Search .......... 327/551–559
See application file for complete search history.

(56) References Cited

U.S. PATENT DOCUMENTS

| | | | | |
|---|---|---|---|---|
| 4,965,867 A | * | 10/1990 | Tsuchida et al. | 341/118 |
| 5,493,343 A | * | 2/1996 | Knutson et al. | 348/691 |
| 6,311,051 B1 | * | 10/2001 | Jung | 455/296 |
| 6,680,654 B2 | * | 1/2004 | Fischer et al. | 331/17 |

\* cited by examiner

*Primary Examiner*—Dinh T. Le (57) ABSTRACT

The present disclosure describes methods and apparatus for compensating DC offset in a filter having a plurality of transconductance pieces. In one implementation, the method includes measuring a corresponding DC offset associated with each transconductance piece of the plurality of transconductance pieces; storing each measured DC offset corresponding to each transconductance piece of the plurality of transconductance pieces; selecting one or more of the plurality of transconductance pieces to be used during operation of the filter; deriving an aggregate amount of DC offset for the one or more selected transconductance pieces, the aggregate amount of DC offset being derived based on each stored DC offset value corresponding to each selected transconductance piece; and applying the derived aggregate amount of DC offset to the one or more selected transconductance pieces to compensate for the DC offset during the operation of the filter.

8 Claims, 9 Drawing Sheets

BACKGROUND OFFSET CANCELLATION SCHEME FOR CONTINUOUS TIME GM-C FILTERS

RELATED APPLICATIONS

This application claims the benefit of U.S. Provisional Application No. 61/059,953, filed Jun. 9, 2008, the contents of which is herein incorporated by reference in its entirety.

TECHNICAL FIELD

This invention relates generally to the field of electronic circuits, more particularly, to methods and systems for minimizing direct current (DC) offset in filters that may be used in various electronic circuits.

BACKGROUND

The growing demands for portable electronic equipment and silicon-on-chip (SOC) products have been pushing the industry to design circuits with low power supply voltage, low power consumption, and smaller chip area. To meet this growing demand, integrated tunable filters have recently received great attention.

Tunable continuous time filters can be used for a variety of applications such as, for example, to remove aliasing and reduce in-band noise in various analog front-end systems, as realization of bandpass filters, as VCOs (voltage controlled oscillators), as loop filters for PLLs (phase-locked loops), and other such applications. Because of their efficient operation at high frequencies, and their easy integration with prevailing circuit fabrication technologies, transconductance-capacitor or gm-C filters have become very popular.

Transconductance elements form the building blocks for most gm-C filters. Currently, there exists several well known realizations for conductive metal oxide semiconductor (CMOS) transconductors. However, because of their low power and low supply voltage requirements, transconductors implementing a differential MOS transistor structure have been preferred. Currently, a CMOS gm-C filter simulating an inductance-capacitance (LC) ladder is commonly used in high-speed and high-throughput systems, such as hard-disk drives or optical disc drives.

With the ever increasing number of digital applications, one of the basic requirements for gm-c filters is for its bandwidth to be digitally (electronically) tuned—i.e., the center frequency or cutoff frequency of the filter may be adjusted electronically by the application of an appropriate control signal (e.g., tuning voltage or signal). gm-C filters are also especially useful because of their ability to be electronically (and rapidly) tuned to different bandwidth settings.

A control signal is conventionally applied to either a controllable transconductance (gm) or controllable capacitance (C) in a gm-C filter. As is well known, the transconductance of a gm-C filter may be controlled by controlling a bias current that flows in an active device, such as a bipolar or MOS (metal oxide semiconductor) transistor. The capacitance of a gm-C filter may be controlled by applying an appropriate tuning voltage to a voltage-dependent capacitance (such as a varactor diode), or by selectively switching fixed, binary-weighted capacitors. However, in high speed and high throughput systems, because of the parasitic capacitance of transistors, controlling the transconductance to tune a gm-C filter is preferred over controlling the capacitance.

A problem that commonly plagues gm-C filters is direct current (DC) offset. Because various mismatch characteristics can exist in the transistors used in a gm-C filter, in a DC coupling channel, these mismatch characteristics can make a signal non-linear, and generate an internal DC offset that can affect the true output of the gm-C filter. Additionally, because of the differential circuit structure adopted by gm-C filters, DC offset can also be propagated to the other stages in the gm-C filter, and increase across the various stages. Therefore, the overall performance of a gm-C filter can be degraded.

Current schemes to eliminate DC offset involve taking the filter offline for a duration of time and calibrating the filter to eliminate the DC offset. This process is repeated each time the filter is tuned to a different bandwidth setting. However, taking the filter offline can impose heavy restrictions on the performance of a gm-C filter especially in high-speed and high-throughput environments.

SUMMARY

The present disclosure describes methods and apparatus for compensating DC offset in a filter having a plurality of transconductance pieces. In one implementation, the method includes measuring a corresponding DC offset associated with each transconductance piece of the plurality of transconductance pieces; storing each measured DC offset corresponding to each transconductance piece of the plurality of transconductance pieces; selecting one or more of the plurality of transconductance pieces to be used during operation of the filter; deriving an aggregate amount of DC offset for the one or more selected transconductance pieces, the aggregate amount of DC offset being derived based on each stored DC offset value corresponding to each selected transconductance piece; and applying the derived aggregate amount of DC offset to the one or more selected transconductance pieces to compensate for the DC offset during the operation of the filter.

Additional features and advantages of the invention are set forth in part in the description which follows, and in part will be obvious from the description, or may be learned by practice of the invention.

The accompanying drawings, which are incorporated in and constitute a part of this specification, illustrate embodiments of the invention and, together with the description, serve to explain the principles of the invention.

In the figures, elements having the same designation have the same or similar functions.

DETAILED DESCRIPTION

Reference will now be made in detail to embodiments of the present invention, examples of which are illustrated in the accompanying drawings. The same reference numbers will generally be used throughout the drawings to refer to the same or like parts.

In the following description and claims, the terms "coupled" and "connected," along with their derivatives, may be used. It should be understood that these terms are not intended as synonyms for each other. Rather, in particular embodiments, "connected" and/or "coupled" may be used to indicate that two or more elements are in direct physical or electronic contact with each other. However, "coupled" may also mean that two or more elements are not in direct contact with each other, but yet still cooperate, communicate, and/or interact with each other.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

An operational transconductance amplifier (OTA) is a building block of a gm-filter. An OTA can deliver an output current ($I_{out}$) that is proportional to an applied input voltage ($V_{in}$). For a CMOS device, the relationship between the input voltage and output current can be expressed as:

$$I_{out} = gm * V_{in} \quad (1),$$

where gm is the transconductance of the OTA. When a capacitor is coupled to the output of an OTA, an integrator can be formed. An OTA-capacitor (OTA-C) filter (or gm-C filter) can be implemented by coupling together one or more integrators.

Figure 1A:
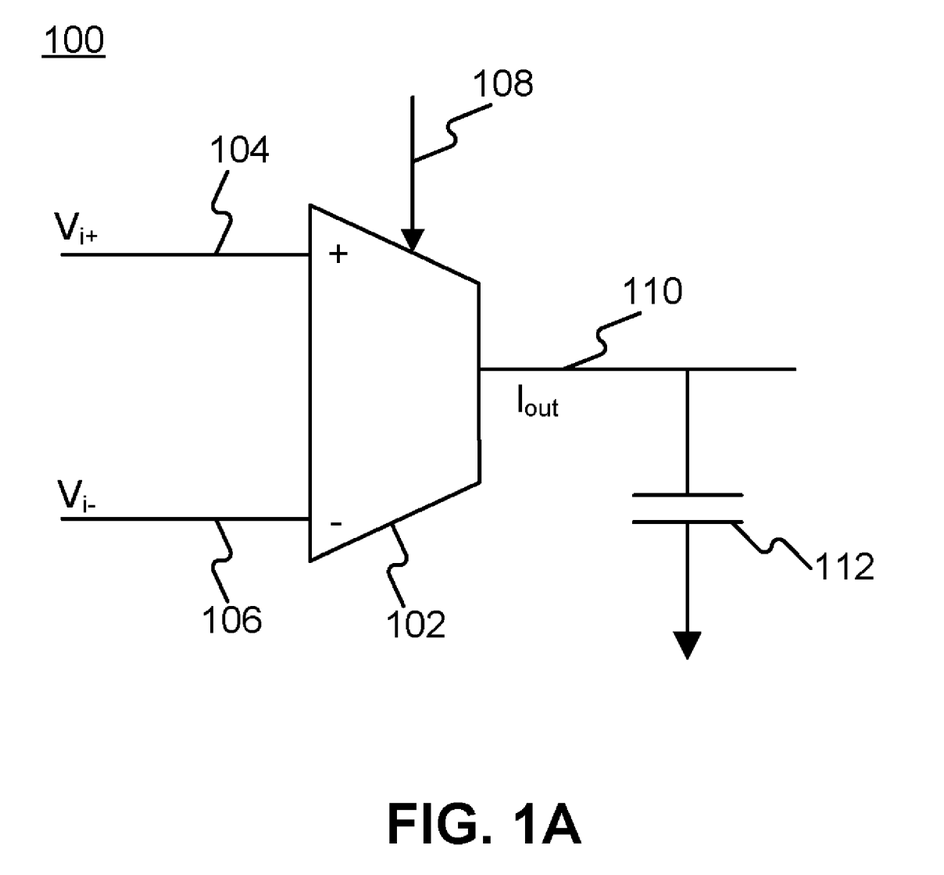
FIG. 1A illustrates a block diagram of a continuous time filter.

FIG. 1A illustrates an exemplary block diagram of a gm-C filter 100. The gm-C filter 100 includes an OTA (gm-piece) 102 coupled to a capacitor 112. Gm-piece 102 includes a positive input terminal 104, a negative input terminal 106, and an output terminal 110. A positive input voltage ($V_{i+}$) can be applied across terminal 104 and a negative input voltage ($V_{i-}$) can be applied across terminal 106. From equation (1), $$V_{in} = V_{i+} - V_{i-} \quad (2),$$

and the output across terminal 110 can be expressed as:

$$I_{out} = gm * (V_{i+} - V_{i-}) \quad (3),$$

where gm is the transconductance of gm-piece 102. As shown in FIG. 1A, gm-piece 102 also includes a control input 108. The transconductance of gm-piece 102 can be changed (varied) via control input 108 by applying an appropriate control signal. As can be seen from equation (3), the output across terminal 110 can be varied by varying the transconductance of gm-piece 102.

Figure 1B:
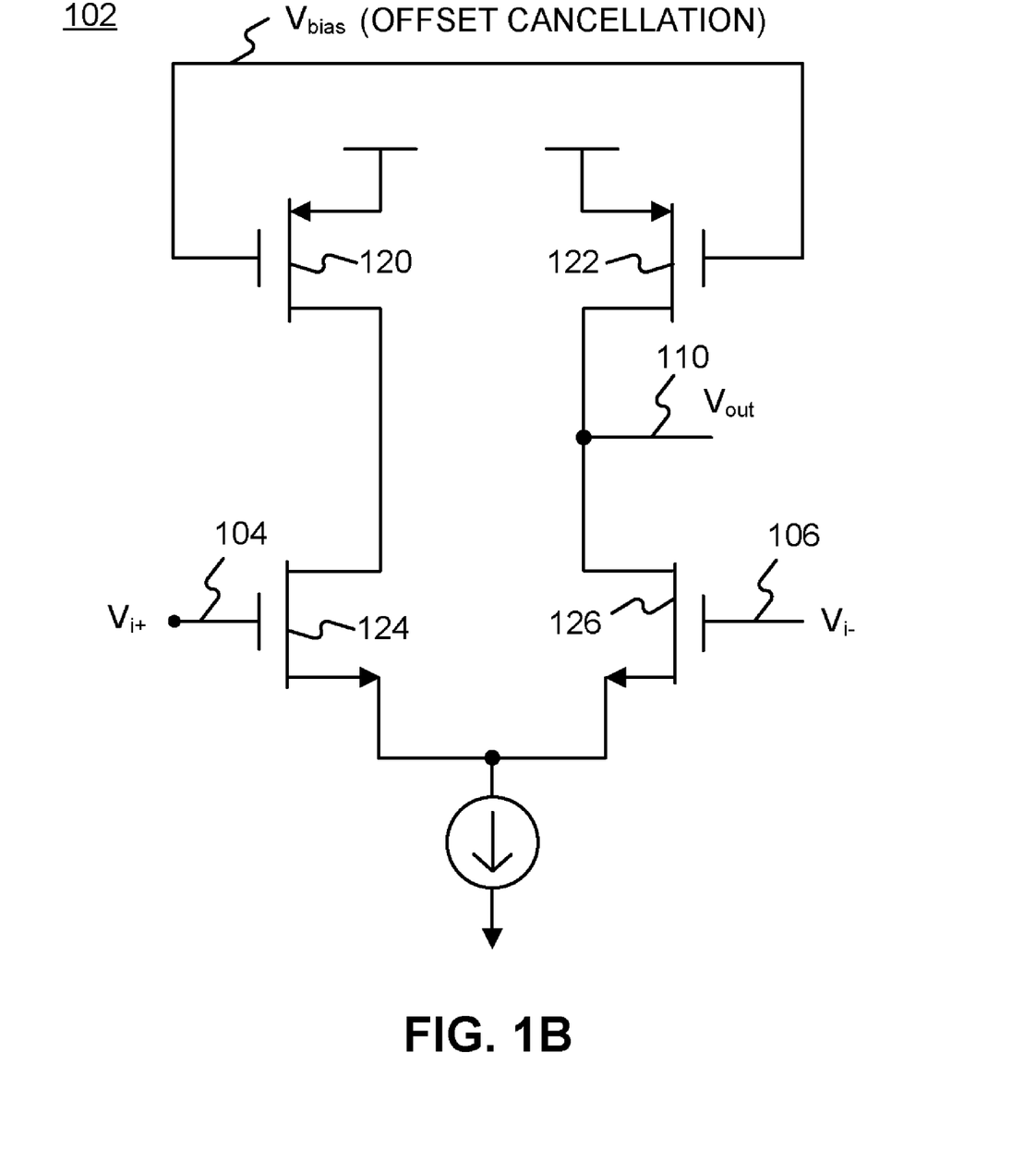
FIG. 1B illustrates a schematic of an operational transconductance amplifier (OTA).

FIG. 1B illustrates an example transistor level schematic of the gm-piece 102. In one embodiment, the gm-piece 102 includes transistors 120, 122, 124, and 126 connected in a differential pair configuration. As discussed above, voltages $V_{i+}$ and $V_{i-}$ can be applied across terminals 104 and 106, respectively, and an output can be received via terminal 110.

Figure 2:
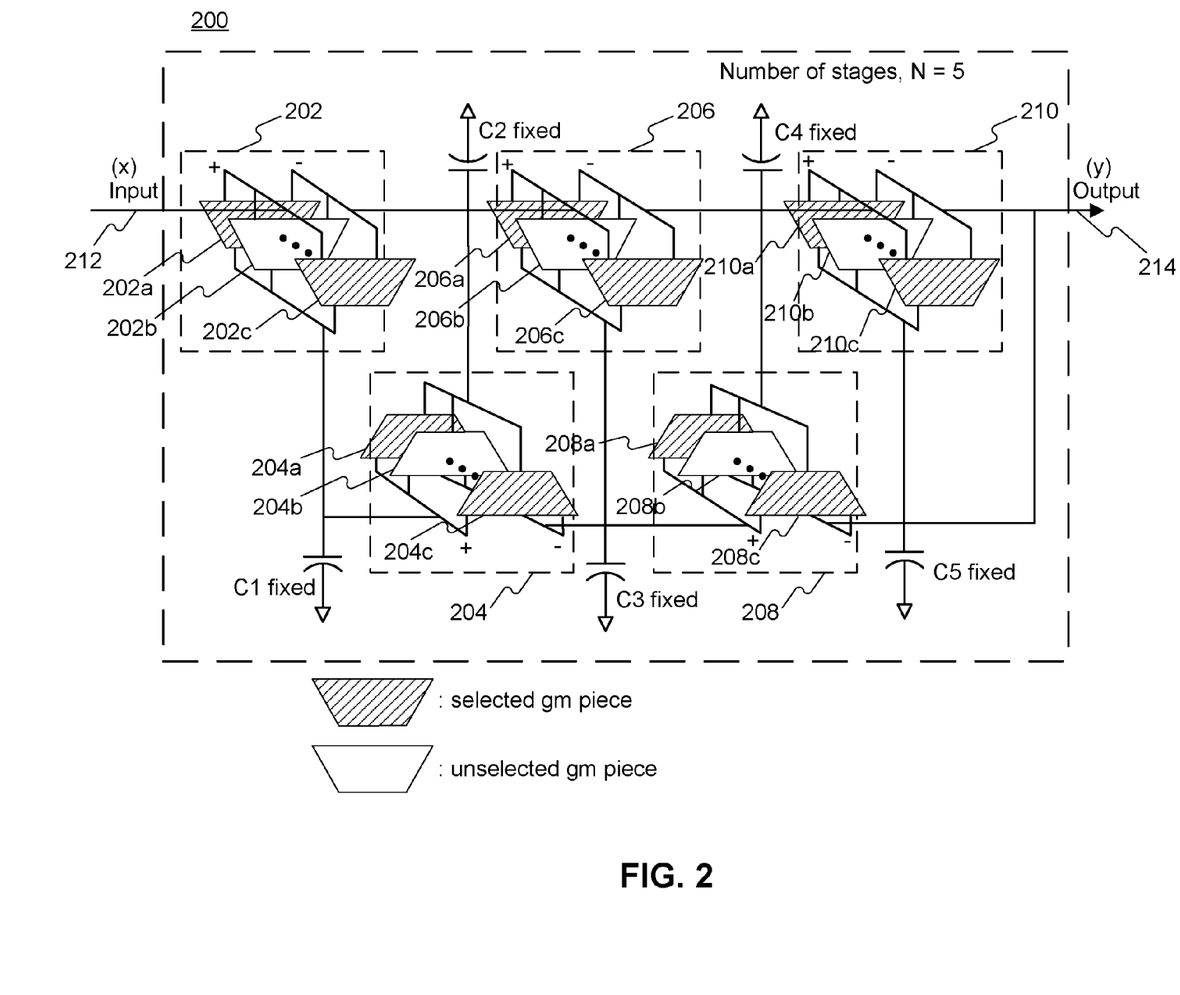
FIG. 2 illustrates a block diagram of an exemplary filter architecture.

FIG. 2 illustrates an exemplary architecture of a tunable gm-C filter 200. As shown in FIG. 2, filter 200 includes gm-banks (202, 204, 206, 208, and 210), and each gm-bank includes one or more gm-pieces (such as gm-piece 102) coupled in a serial and/or parallel manner. For example, FIG. 2 depicts gm-banks (202, 204, 206, 208, and 210) as each including three gm-pieces (202a, 202b, 202c, 204a, 204b, 204c, 206a, 206b, 206c, 208a, 208b, 208c, 210a, 210b, 210c), respectively. Although, FIG. 2 depicts five gm-banks each including three gm-pieces, a tunable gm-C filter can generally have any number of gm-banks, and each gm-bank can include any number of gm-pieces. Therefore, the present disclosure is not limited in the number of gm-banks and/or gm-pieces that may be included and supported by a filter that is consistent with the present invention.

As shown in FIG. 2, filter 200 further includes fixed capacitors ($C_1$, $C_2$, $C_3$, $C_4$, and $C_5$) coupled with gm-banks (202, 204, 206, 208, and 210), respectively. A gm-bank coupled with an associated capacitor forms a stage in a filter. For example, gm-bank 202 and capacitor $C_1$ form a first stage, gm-bank 204 and capacitor $C_2$ form a second stage, and so on. For convenience, FIG. 2 depicts filter 200 as a five stage filter. However, a filter may include any number of stages (N). Therefore, the present disclosure is not limited in the number of stages that may be included and supported by a filter that is consistent with the present invention.

As discussed below in connection with FIGS. 3A and 3B, in some embodiments, a control terminal (such as control terminal 108) of each gm-piece in a gm-bank can be coupled to receive a bandwidth (BW) signal. In one embodiment, the BW signal includes information that tunes filter 200 to any of S total number of bandwidth settings (where S is an integer) by selecting (turning on/off) one or more gm-pieces in one or more gm-banks. For example, FIG. 2 depicts a selected gm-piece as highlighted in a dark shade such as (202a, 202c, 204a, 204c, etc.), and depicts an unselected gm-piece as highlighted in a lighter shade (or unshaded) such as (202b, 204b, etc.). It should be understood that any number of gm-pieces can be selected by signal BW to tune filter 200 to a given bandwidth. Therefore, the present disclosure is not limited in the number of gm-pieces that can be selected by a bandwidth signal consistent with the present disclosure. In some embodiments, gm-piece can be turned on/off via a corresponding control input.

Filter 200 is coupled to receive an input signal (x) via an input terminal 212 and provides a corresponding output signal (y) via an output terminal 214. Output signal (y) represents a version of input signal (x) that has been filtered at a given bandwidth setting S.

As discussed above, the performance of a filter (such as filter 200) can be degraded due to a DC offset caused by a random mismatch of transistors (such as transistors 120, 122, 124, and 126 (not shown in FIG. 2)) in one or more gm-pieces such as gm-pieces 202a, 202b, etc. Therefore, to improve the performance of filter 200, DC offset needs to be minimized or eliminated.

Figure 3A:
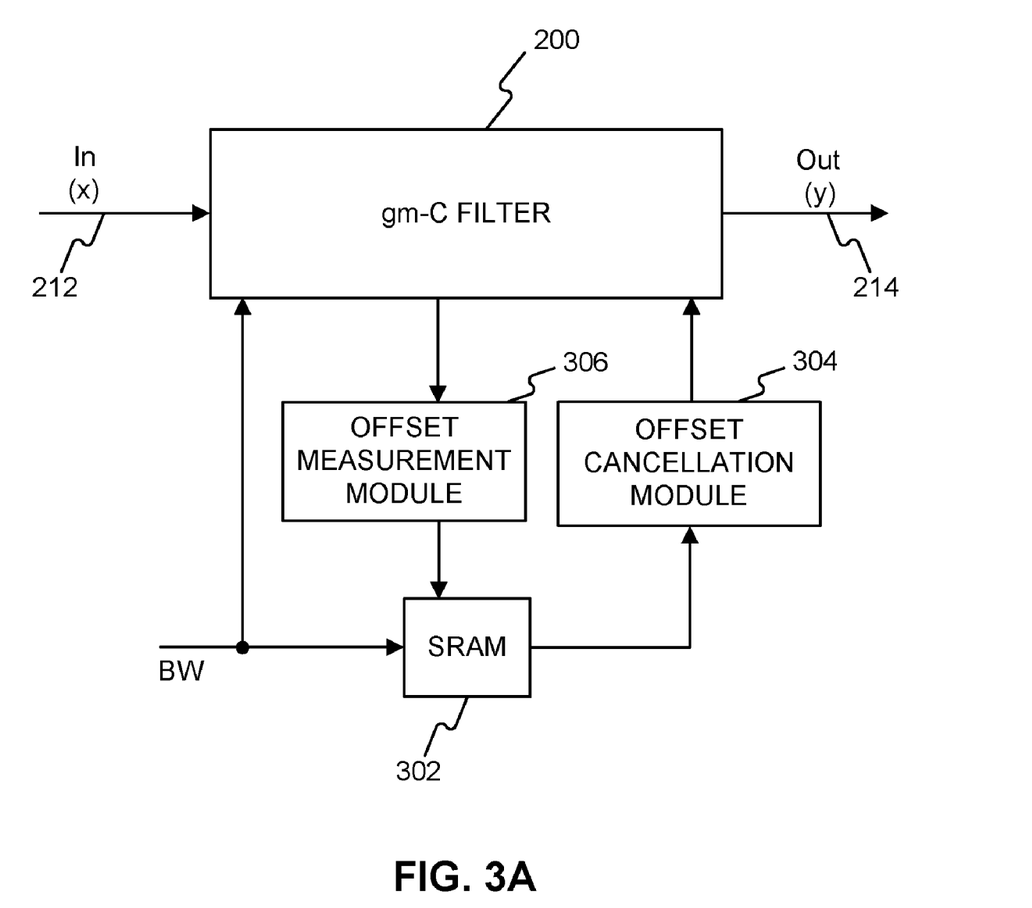
FIGS. 3A and 3B illustrate block diagrams of structures for eliminating DC offset.

FIG. 3A is a block diagram of a structure for eliminating DC offset. As illustrated in FIG. 3A, filter 200 is coupled to an offset measurement (OM) module 306. Offset measurement module 306 is further coupled with a memory 302. In some embodiments, memory 302 can be a static random access memory (SRAM). As discussed in greater detail below, offset measurement module 306 measures a DC offset associated with each individual gm-piece within filter 200, and stores the measured DC offset values in memory 302. The measured offset values can be stored in memory 302 as binary (digital) codes. During operation (e.g., during power-up calibration), an aggregate amount of DC offset associated with selected gm-pieces (of a given bandwidth setting S) can be determined by an offset cancellation (OC) module 304 and fed into filter 200 to compensate for the total DC offset associated with the bandwidth setting S. Although offset measurement module 306 and offset cancellation module 304 are illustrated as two separate modules, the two modules can be implemented as a single module.

Figure 3B:
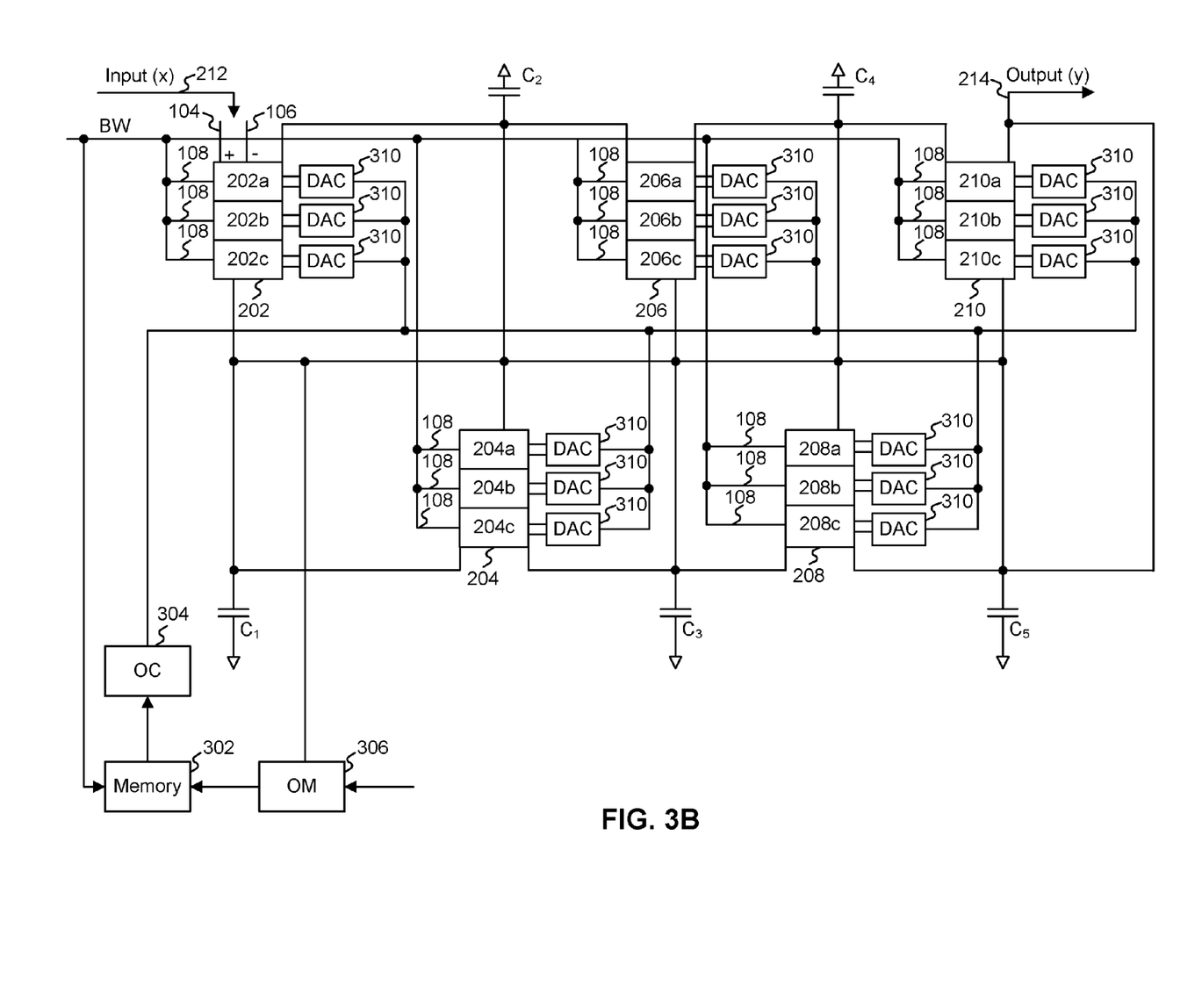

FIG. 3B illustrates a detailed block diagram of filter 200 discussed with respect to FIG. 3B. As shown in FIG. 3B, each gm-piece can be coupled to a digital to analog converter (DAC) such as exemplary DAC 310. In one embodiment, a single DAC is associated with each stage in the filter 200. In one embodiment, a DC offset associated with each individual gm-piece is measured by offset measurement module 306 and stored in memory 302, e.g., during initial power up of filter 200. In one embodiment, offset measurement module 306 measures a DC offset associated with a given gm-piece by comparing the output of the gm-piece in response to a known input training signal applied across the input terminals 104 and 106 of the gm-piece. In one embodiment, each offset value associated with each gm-piece is stored as a digital code in memory 302.

During operation, filter 200 can be tuned to a given bandwidth setting S in response to a bandwidth (BW) signal. As shown in FIG. 3B, each gm-piece in filter 200 can be coupled to receive the BW signal via a respective control terminal 108. Upon receiving the BW signal, appropriate gm-pieces in filter 200 are turned on or off to achieve the bandwidth setting S. In one embodiment, offset cancellation module 304 retrieves from memory 302 the digital codes associated with the selected gm-pieces for bandwidth setting S, and feeds the retrieved digital codes to the DACs corresponding to the selected gm-pieces. Each associated DAC can then apply an offset voltage (indicated by the corresponding digital code) across each respective selected gm-piece to compensate for the DC offset associated with the gm-piece.

Figure 4:
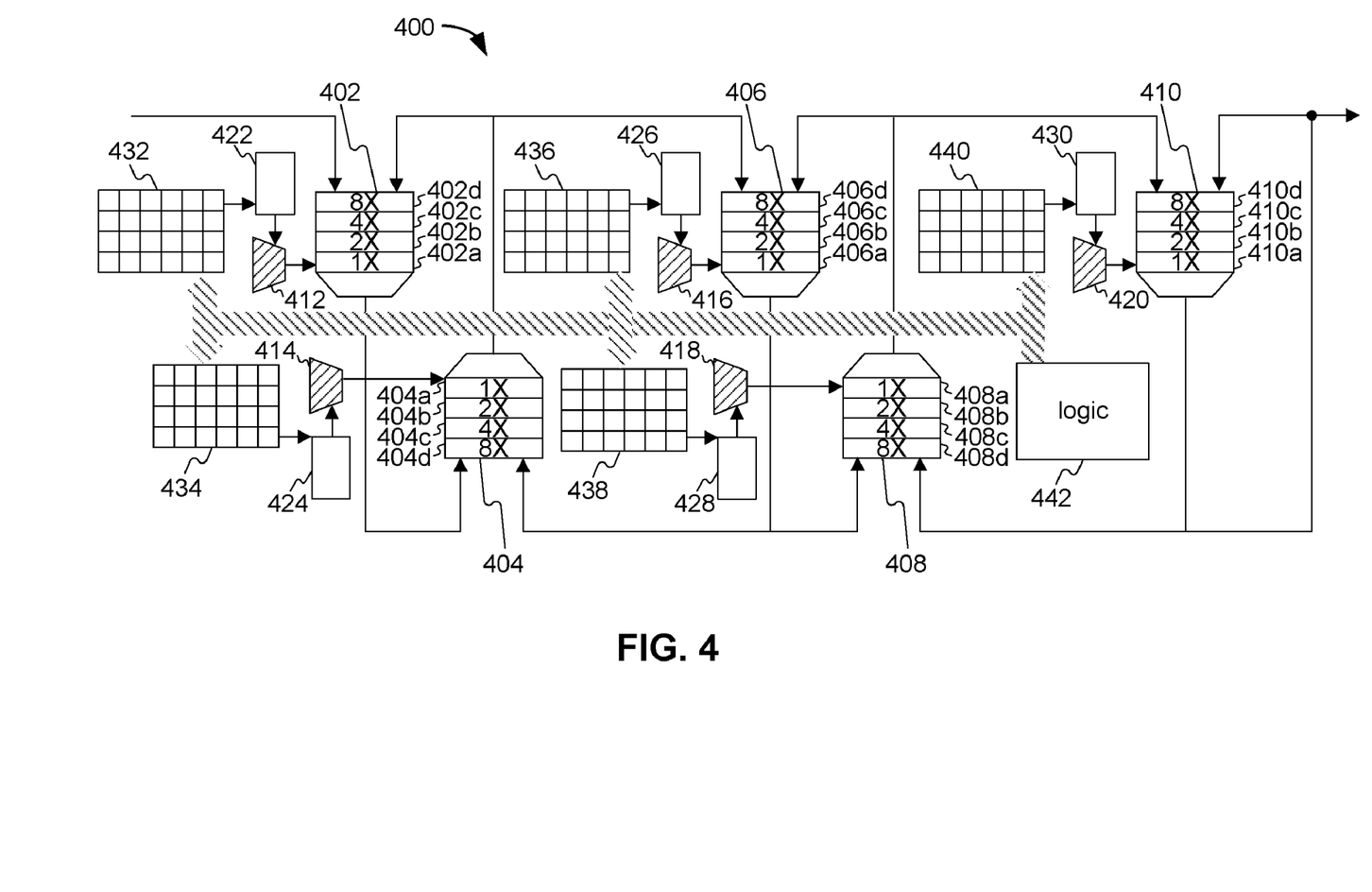
FIG. 4 illustrates a block diagram of an exemplary filter architecture.

To further reduce initial calibration time, (in one embodiment, a background DC offset elimination scheme can be implemented. FIG. 4 illustrates a block diagram of a filter 400 that can implement background DC offset elimination. As shown in FIG. 4, filter 400 includes gm-banks (402, 404, 406, 408, and 410), and each gm-bank includes four gm-pieces 402a, 402b, 402c, 402d, 404a, 404b, 404c, 404d, 406a, 406b, 406c, 406d, 408a, 408b, 408c, 408d, 410a, 410b, 410c, 410d, respectively. The gm-banks and gm-pieces of filter 400 can be similar if not identical in structure to the gm-banks and gm-pieces discussed with respect to filter 200 in FIG. 2.

For convenience, FIG. 4 depicts five gm-banks, with each gm-bank including four gm-pieces. However, as discussed above, a filter can include any number of gm-banks and any number of gm-pieces. In some embodiments, DC offset of filter 400 can be compensated in a manner similar to that discussed with respect to FIGS. 3A and 3B. For example, in FIG. 3A, filter 400 can be used in place of filter 200.

In some embodiments, to increase the tuning range of filter 400, the gm-pieces in each filter bank can include transconductances that can be in ratio with one another. For example, gm-piece 402a can include a transconductance (gm), gm-piece 402b can include a transconductance of (2×gm), gm-piece 402c can include a transconductance of (4×gm), and 402d can include a transconductance of (8×gm). Similarly, gm-pieces associated with gm-banks (404, 406, 408, and 410) can include transconductances that are in similar ratios with one another. For convenience, FIG. 4 depicts four gm-pieces in each gm-bank whose transconductances are in a ratio of (1×, 2×, 4× and 8×), however, other ratios may be implemented in a given gm-bank.

As is shown in FIG. 4, filter 400 also includes DACs (412, 414, 416, 418 and 420) coupled to gm-banks (402, 404, 406, 408 and 410), respectively. DACs (412, 414, 416, 418 and 420) are coupled to offset cancellation modules (422, 424, 426, 428 and 430), respectively, and offset cancellation modules (422, 424, 426, 428 and 430) can be further coupled to memories (432, 434, 436, 438 and 440), respectively. In some embodiments, memories (432, 434, 436, 438 and 440) can be implemented as a single memory similar to memory 302 discussed with respect to FIGS. 3A and 3B. As shown in FIG. 4, memories (432, 434, 436, 438 and 440) can be further coupled to a logic module 442. In one embodiment, logic module 442 can include one or more portions of an offset cancellation module or an offset measurement module—e.g., (in one implementation) the offset measurement module for each stage in filter 400 can be implemented in logic module 442. In one embodiment, the offset cancellation modules (422, 424, 426, 428 and 430) can be configured to substantially eliminate the DC offset in filter 400.

During initial calibration of filter 400, DC offset associated with each gm-piece in each gm-bank is calculated and stored in a corresponding memory. For example, offset values for each gm-piece (402a, 402b, 402c, and 402d) can be calculated and individually stored in memory 432. Similarly, the offset values for gm-pieces included in gm-banks (404, 406, 408 and 410) can be measured and stored in memories (434, 436, 438 and 440), respectively. The offset values for each gm-piece can be measured in a manner similar to that discussed with respect to FIGS. 3A and 3B. Similarly, the offset values for each gm-piece can be stored in a corresponding memory as a digital code.

Because the offset associated with each gm-piece can be random, in order to minimize error, the length (in bits) of a digital code needed to represent an offset value can be derived from the Gaussian distribution of the random offset of each gm-piece. In some embodiments, a digital code having a length of six bits (D[5:0]) can be used to represent an offset value. For example, memory 432 can store a corresponding 6-bit offset value for each gm-piece (402a, 402b, 402c and 402d).

During operation, when filter 400 is tuned to a given bandwidth setting, one or more of the offset cancellation modules (422, 424, 426, 428 and 430) and/or logic module 442 can compensate for the DC offset. Because the offset for each gm-piece in filter 400 is known, each offset cancellation modules (422, 424, 426, 428 and 430) can compensate for the DC offset in a corresponding gm-bank by applying a single aggregate voltage across the gm-bank—i.e., a single aggregate voltage per filter stage. For example, the DC offset for all selected gm-pieces in gm-bank 402 can be compensated by offset cancellation module 442 applying a single aggregate voltage (which corresponds to an accumulation of the individual DC offset values associated with the selected gm-pieces in a given gm-bank 402) via DAC 412. In a similar manner, DC offset across other gm-banks (404, 406, 408 and 410) can be respectively compensated by offset cancellation modules (424, 426, 428 and 430).

Figure 5:
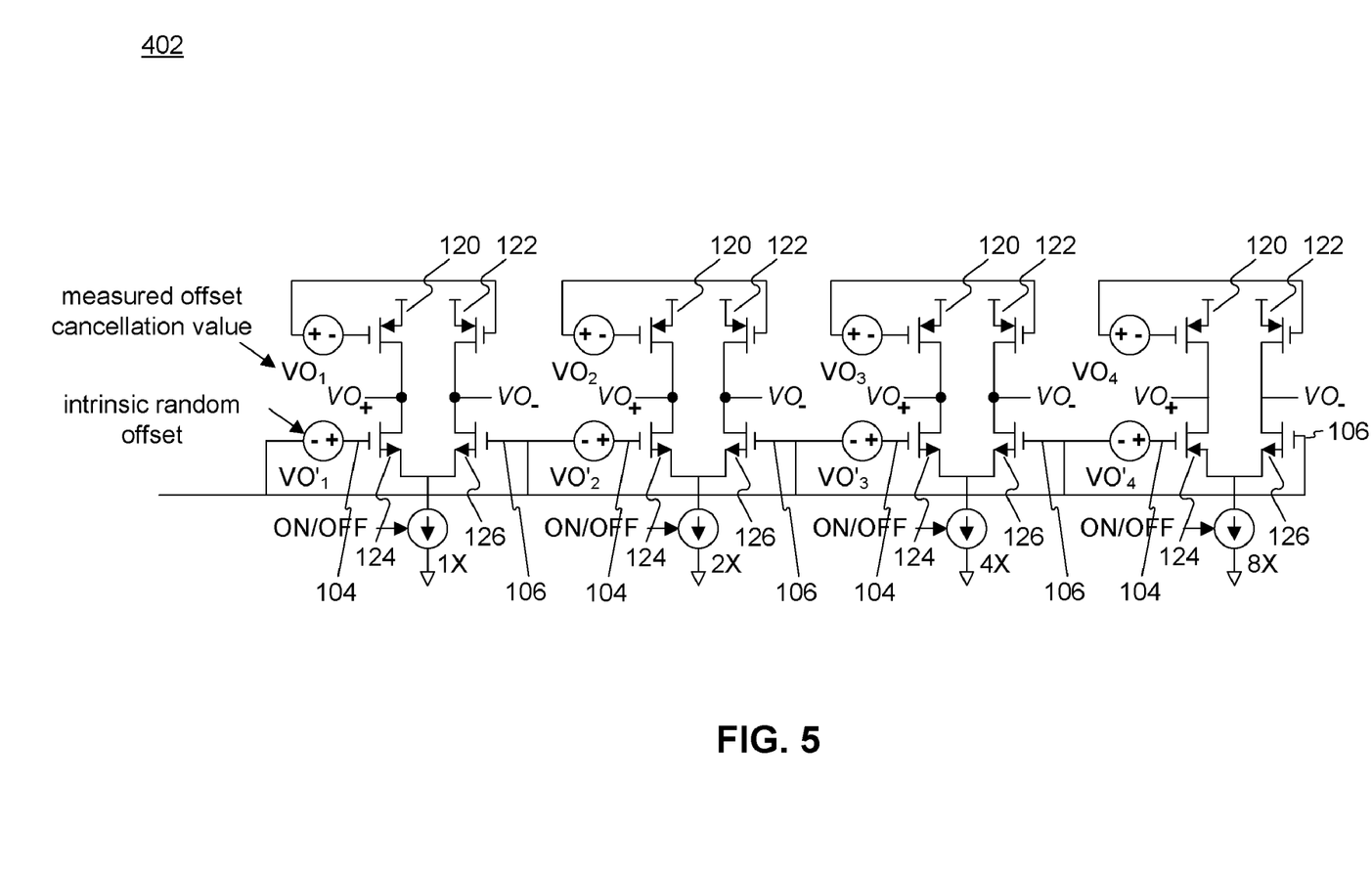
FIGS. 5 and 6 illustrate schematics of structure for eliminating DC offset.

FIG. 5 is a transistor level schematic of gm-bank 402 illustrating an exemplary structure for measuring the DC offset of a gm-piece. The random DC offsets that can exist in gm-pieces (402a, 402b, 402c and 402d) are depicted as hypothetical voltages sources $VO'_1$, $VO'_2$, $VO'_3$ and $VO'_4$, respectively. For example, the DC offset of gm-piece 402a can be measured by coupling the positive and negative input terminals (104 and 106) of gm-piece 402a to a common-mode voltage level (VO), and turning on gm-piece 402a via a respective control terminal. An offset value $VO_1$ can be measured at the output of the gm-piece 402a. Similarly, offset values ($VO_2$, $VO_3$ and $VO_4$) can be measured for gm-pieces (402b, 402c, and 402d), respectively. In some embodiments, each gm-bank such as gm-bank 402 can include appropriate circuitry that can measure offset values ($VO_1$, $VO_2$, $VO_3$ and $VO_4$), and store the measured offset values as digital codes in a memory such as memory 432.

Figure 6:
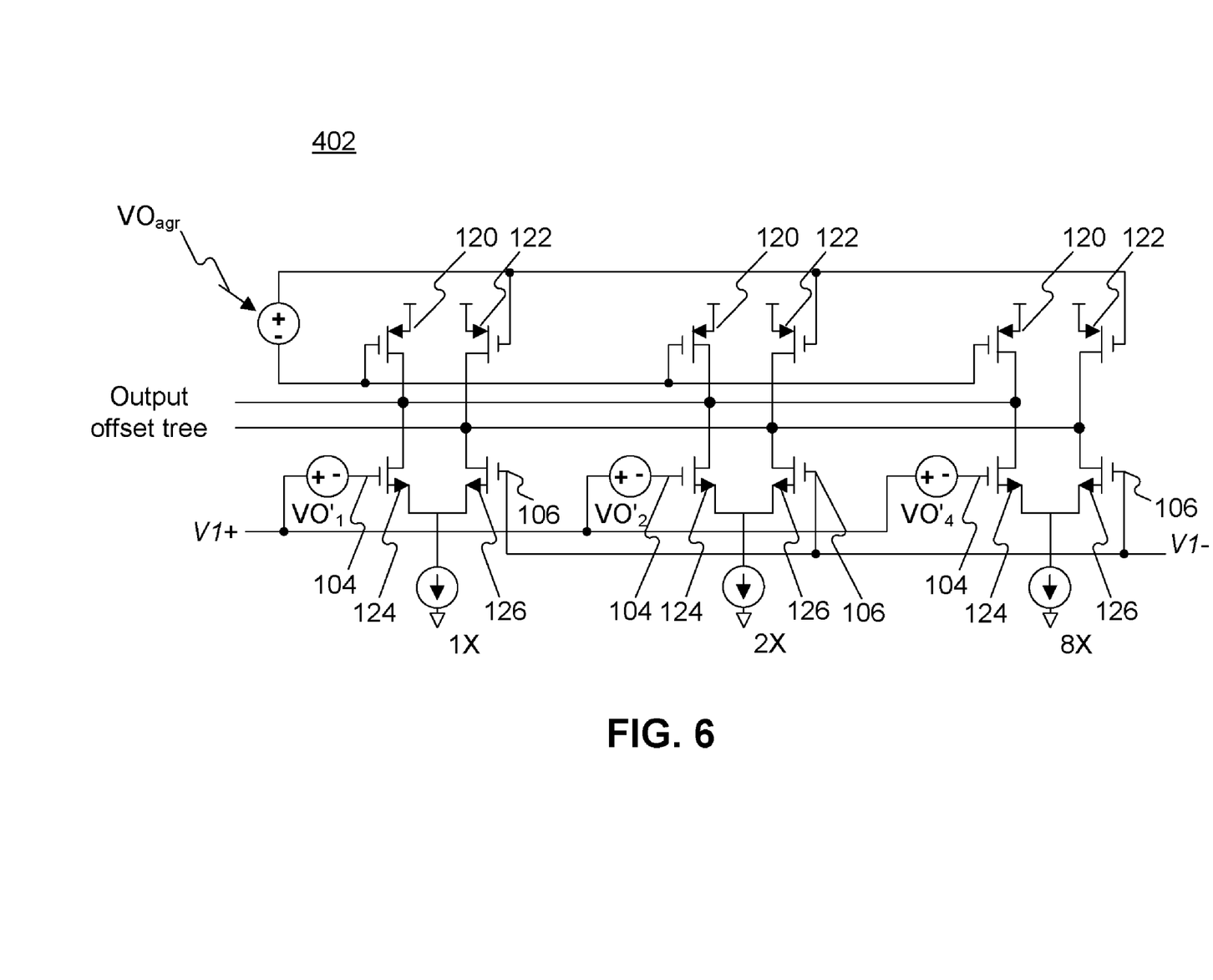

FIG. 6 is a transistor level schematic of gm-bank 402 illustrating an exemplary structure for cancelling DC offset of a gm-piece. FIG. 6 depicts an example when gm-pieces 402a, 402b and 402d are selected to tune filter 400 to a given bandwidth setting S. Because the total DC offset across a gm-bank can be expressed as a function of the offset of each selected gm-piece, DC offset across a gm-bank can be compensated by applying a single aggregate voltage ($VO_{agr}$). As previously discussed, gm-pieces in a given gm-bank can include transconductances that are in a ratio to one other (for example 1×, 2×, 4×, etc). The aggregate voltage ($VO_{agr}$) can be calculated by weighting the offsets of the individual gm-pieces according to the ratio of corresponding transconductances. Therefore, the aggregate voltage ($VO_{agr}$) for a given gm-bank can be expressed as:

$$VO_{agr} = \frac{\sum_{i \in q} w_i VO_i}{\sum_{i \in q} w_i}, \quad (4)$$

where $w_i$ is a weighting factor (ratio of transconductance), $VO_i$ is the measured offset voltage for the i-th gm-piece and q is the number of selected gm-pieces (in the given gm-bank) for a given bandwidth setting S. From equation (4), the aggregate voltage for the example depicted in FIG. 6 can be expressed as:

$$VO_{agr} = \frac{1 * VO_1 + 2 * VO_2 + 8 * VO_4}{1 + 2 + 8} \quad (5)$$

As shown in FIG. 6, a single aggregate voltage $VO_{agr}$ can be applied across all selected gm-pieces in gm-bank 402, and an offset free output can be achieved. Offsets across other gm-banks (filter stages) can be eliminated in a similar manner. Because a single voltage is applied to each gm-bank, only a single DAC may be required to apply aggregate voltage $VO_{agr}$ for each gm-bank (filter stage).

Figure 7:
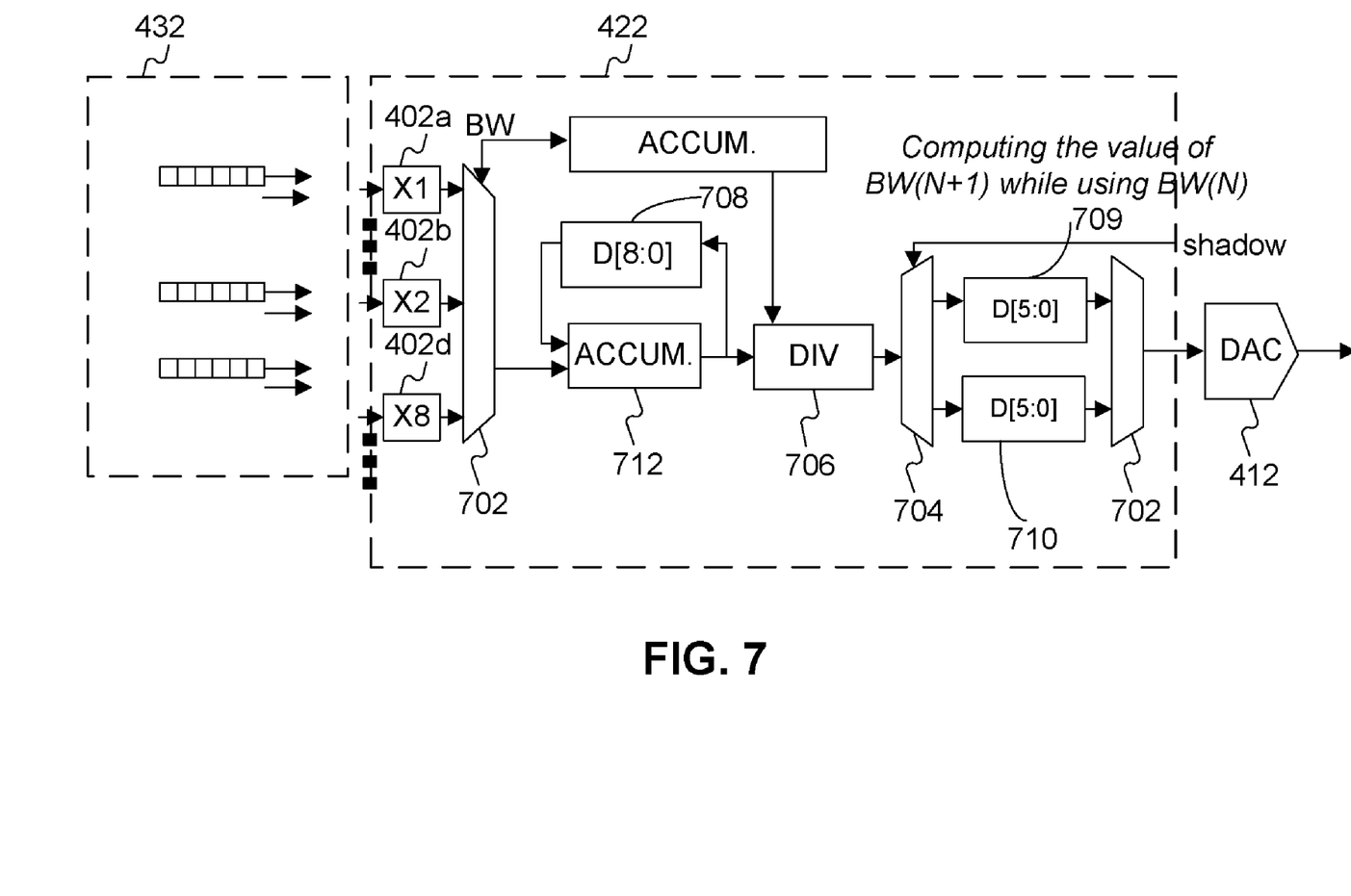
FIG. 7 illustrates a block diagram of a structure for eliminating DC offset.

As discussed above, offset cancellation modules (422, 424, 426, 428 and 430) can be coupled with filter 400 to compensate for the DC offset. In some embodiments, in order to minimize chip area, an offset cancellation module can be shared by two or more gm-banks—e.g., (in one implementation) a single offset cancellation module can be sequentially shared with all the gm-banks in filter 400. FIG. 7 is a block diagram illustrating one embodiment of an offset cancellation module (e.g., offset cancellation module 422. To save the area of the computation logic, a sequential logic can be used and shared among all stages in the filter. An offset value of the selected (transconductance) pieces from the memory 432 is weighted and added to the accumulator 712 via a multiplexer 702. In one embodiment, offset values are multiplied by weights and are accumulated sequentially. If the gm-pieces are binary weighted, the multiplication can be performed via shifting. After all the multiplications and additions are completed, a final value in the accumulator is divided by the sum of the weight according to the bandwidth setting (e.g., through divider 706). The aggregate offset value is derived and stored in a register file via a de-multiplexer 704. Two shadows register files (709, 710) are used in one embodiment. While one register file (e.g., register file 709) is for current use, the other register file (e.g., register file 710) can store the offset values for the next known bandwidth setting. This hides the calculation in the background as long as the computation speed is faster than the switching of bandwidth setting.

In some embodiments, while a first offset value associated with a current bandwidth setting ($S_n$) is stored in register file 709, offset cancellation module 422 can compute a second offset value for a next bandwidth setting ($S_{n+1}$), and store the second offset value in second register file 710. For convenience, FIG. 7 illustrates offset cancellation module 422 as including two register files 709, 710. However, it should be understood that there can be any number of register files that can be included in offset cancellation module 422. Therefore, the present disclosure is not limited in the number of register files that may be included and supported by a filter that is consistent with the present invention.

In some embodiments, to improve the computational efficiency of offset cancellation module 422, the number of bits that can be used by an accumulator such as accumulator 712 can be derived from the distribution of the random offset of each gm-piece in filter 400. The number of bits required by accumulator 422 can be expressed as:

$$\text{ACCU\_BITS} \cong \log 2 \left( \sum_{i=0}^{P-1} \frac{2^B}{W_i} \right), \quad (6)$$

where B is the number of bits of an offset value, $w_i$ is the weighting factor, and P is the number of gm-pieces in a filter stage.

It should be understood that various systems and methods discussed in the above description, can in practice be implemented in hardware, in software executed on one or more hardware components or in a combination of the two.

Other embodiments will be apparent to those skilled in the art from consideration of the specification and practice disclosed herein. It is intended that the specification and examples be considered as exemplary only, with a true scope and spirit of the invention being indicated by the following claims.

What is claimed is:

1. A method to compensate for DC offset in a filter, the filter including a plurality of transconductance pieces, the method comprising:
    measuring a corresponding DC offset associated with each transconductance piece of the plurality of transconductance pieces using an offset measurement module;
    storing each measured DC offset corresponding to each transconductance piece of the plurality of transconductance pieces using the offset measurement module;
    based upon a received bandwidth signal, selecting one or more of the plurality of transconductance pieces to be used during operation of the filter;
    deriving an aggregate amount of DC offset for the one or more selected transconductance pieces, the aggregate amount of DC offset being derived based on each stored DC offset value corresponding to each selected transconductance piece using the offset measurement module; and
    applying the derived aggregate amount of DC offset to the one or more selected transconductance pieces to compensate for the DC offset during the operation of the filter using the offset cancellation module.

2. The method of claim 1, wherein said storing each measured DC offset comprises storing each measured DC offset as a digital code.

3. The method of claim 1, wherein said deriving an aggregate amount of DC offset comprises multiplying a stored DC offset value corresponding to a selected transconductance piece by a predetermined weight.

4. The method of claim 1, wherein said selecting one or more of the plurality of transconductance pieces comprises selecting the one or more of the plurality of transconductance pieces in response to a change in a bandwidth setting of the filter.

5. An apparatus comprising:
- a filter including a plurality of transconductance pieces;
- an offset measurement module to measure a corresponding DC offset associated with each transconductance piece of the plurality of transconductance pieces;
- a memory to store each measured DC offset corresponding to each transconductance piece of the plurality of transconductance pieces;
- a selector to select one or more of the plurality of transconductance pieces for use during operation of the filter; and
- an offset cancellation module to:
  - derive an aggregate amount of DC offset for the one or more selected transconductance pieces, the aggregate amount of DC offset being derived based on each stored DC offset value corresponding to each selected transconductance piece; and
  - apply the derived aggregate amount of DC offset to the one or more selected transconductance pieces to compensate for the DC offset during the operation of the filter.

6. The apparatus of claim 5, wherein each measured DC offset is stored as a digital code in the memory.

7. The apparatus of claim 5, wherein the offset cancellation module is further configured to multiply a stored DC offset value corresponding to a selected transconductance piece by a predetermined weight.

8. The apparatus of claim 5, wherein the selector is configured to select the one or more of the plurality of transconductance pieces in response to a change in a bandwidth setting of the filter.

* * * * *